United States Patent
Fang et al.

(10) Patent No.: US 8,610,003 B2
(45) Date of Patent: Dec. 17, 2013

(54) SHIELDING PLATE AND SHIELDING ASSEMBLY WITH SAME

(75) Inventors: Xin Fang, Shenzhen (CN); Guang-Fei Cao, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 81 days.

(21) Appl. No.: 13/327,467

(22) Filed: Dec. 15, 2011

(65) Prior Publication Data

US 2013/0000969 A1    Jan. 3, 2013

(30) Foreign Application Priority Data

Jun. 30, 2011   (CN) .......................... 2011 2 0227752

(51) Int. Cl.
H05K 9/00 (2006.01)

(52) U.S. Cl.
USPC .......................................... 174/382; 174/385

(58) Field of Classification Search
USPC ............................ 174/377, 382, 385; 361/818
See application file for complete search history.

(56) References Cited

U.S. PATENT DOCUMENTS

| | | | |
|---|---|---|---|
| 7,208,675 B2* | 4/2007 | Horng | 174/377 |
| 7,724,542 B2* | 5/2010 | Gallahan et al. | 361/816 |
| 2002/0139552 A1* | 10/2002 | Chang | 174/350 |
| 2002/0139562 A1* | 10/2002 | Daane et al. | 174/113 R |
| 2011/0266045 A1* | 11/2011 | Xiong et al. | 174/350 |
| 2012/0015127 A1* | 1/2012 | Kurz et al. | 428/43 |

* cited by examiner

*Primary Examiner* — Hung Ngo

(74) *Attorney, Agent, or Firm* — Altis & Wispro Law Group, Inc.

(57) ABSTRACT

A shielding structure includes a frame and a removable plate. The frame includes a peripheral wall, and the removable plate located in the opening may be fixed to the connecting board, the removable plate defining an access hole. A scored line is defined between the removable plate and the connecting board. The shielding structure further defines an arcuate gap between the removable plate and the connecting board and communicating with the scored line, and a mating hole, the arcuate gap is for increasing the shearing stresses on shielding structure the scored line when the removable plate must be removed.

15 Claims, 6 Drawing Sheets

SHIELDING PLATE AND SHIELDING ASSEMBLY WITH SAME

BACKGROUND

1. Technical Field

This disclosure relates to a shielding structure, particularly to a shielding layer with a removable plate.

2. Description of Related Art

Many portable electronic devices, such as mobile phones, generally include a printed circuit board with one or more electrical components and a shielding assembly mounted to the printed circuit board to shield the electrical components from various forms of EMI. The shielding layer generally has a removable plate to allow exposure of the electrical components. However, if the shielding plate is part of the structure of the shielding layer it is not easy to remove the shielding structure.

Therefore, there is a room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary shielding structure. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
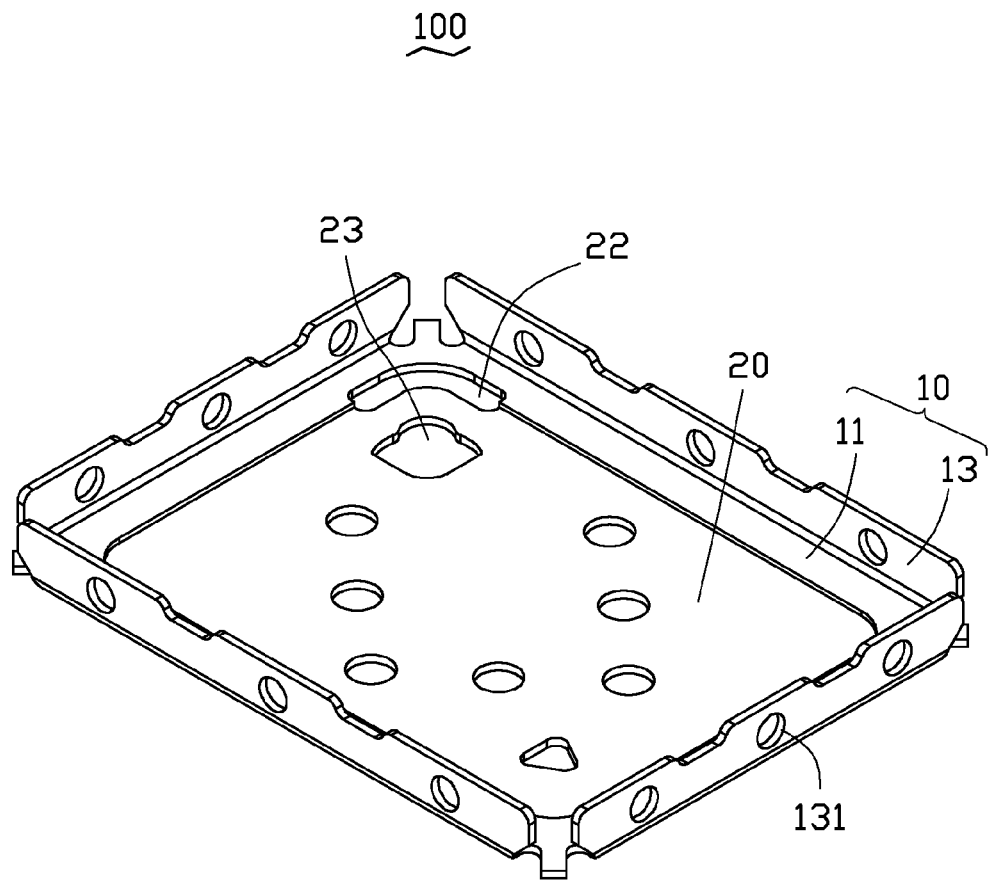
FIG. 1 is a schematic view of an exemplary embodiment of a shielding assembly.
Figure 5:
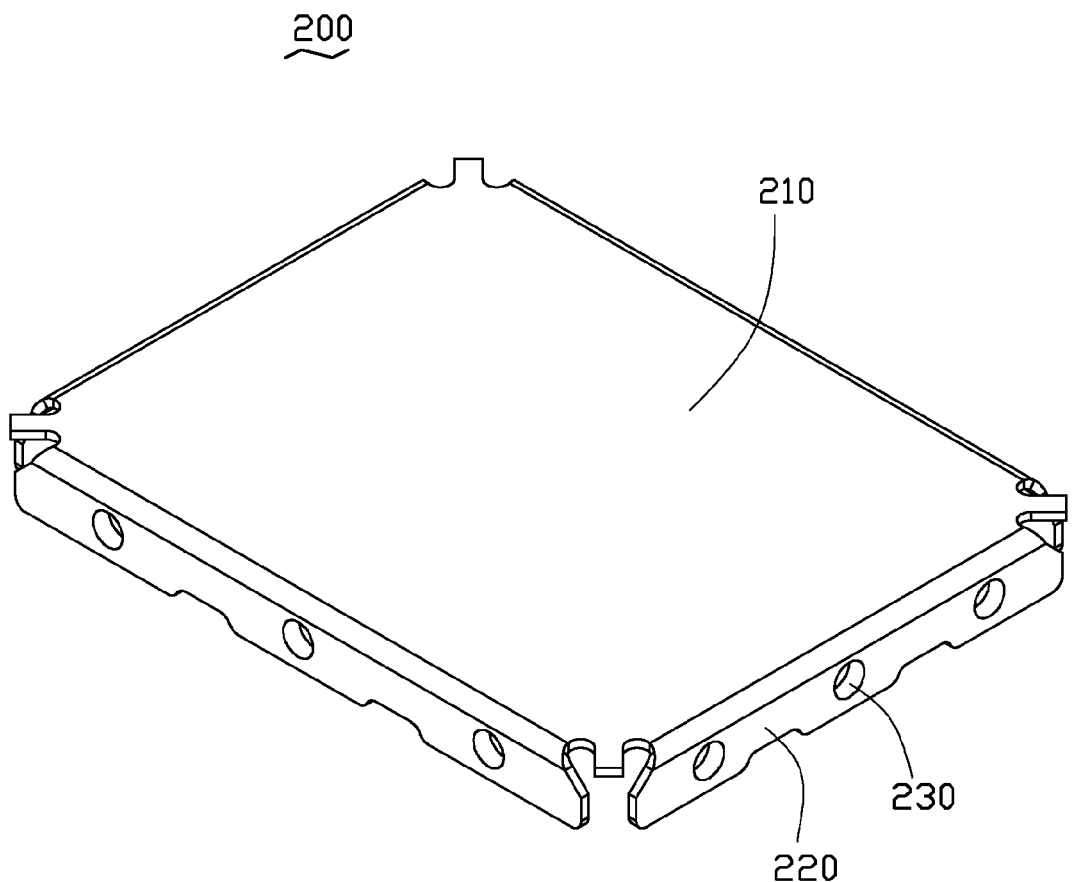
FIG. 5 is a schematic view of a shielding cover shielding structure after the removable plate is removed the shielding structure.

Referring to FIGS. 1 and 5, the present disclosure discloses a shielding structure 100 and a shielding cover 200. The shielding structure 100 may be mounted to or over a circuit board of an electronic device (not shown), for protecting the electrical components of the electronic device from any electromagnetic interference (EMI). The shielding structure 100 is metallic or made of metal.

Figure 2:
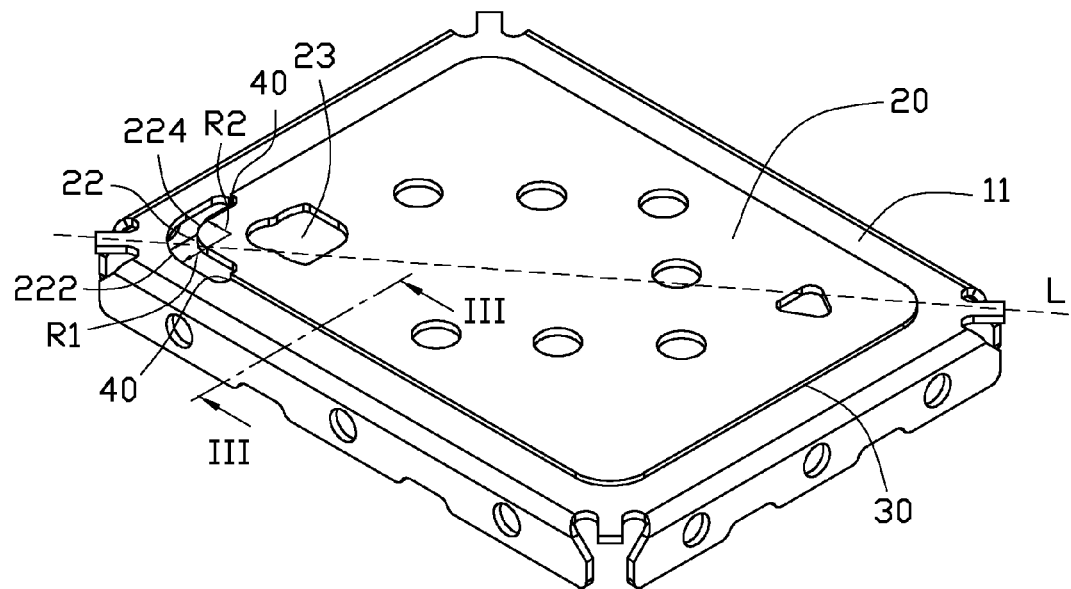
FIG. 2 is an schematic view of the shielding assembly of FIG. 1.
Figure 3:
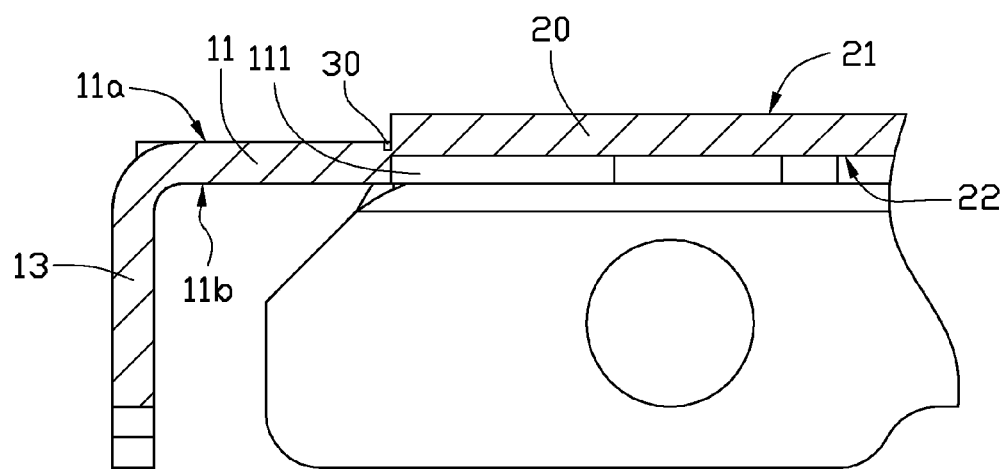
FIG. 3 is a cross-sectional view of the shielding assembly shown in FIG. 2 along the line III-III.

Referring to FIGS. 2 and 3, the shielding structure 100 includes a frame 10 and a removable plate 20. The frame 10 is substantially an open frame, and includes a peripheral wall 13, a connecting board 11 protruding from an inner surface of the peripheral wall 13 and having main parallel planar surfaces 11a, 11b, and an opening 111 of the same size and shape as the removable plate 20. The removable plate 20 also has main parallel planar surfaces 21, 22, and is located in the opening 111 and fixed to the connecting board 11. The main planar surfaces of the connecting board are not coplanar with the main planar surfaces of the removable plate. In this exemplary embodiment, the removable plate 20 may be an element formed by punching but not detaching the connecting board 11. The shielding structure 100 further defines a plurality of latching holes 131 through the peripheral wall 13, and defines a deep peripheral groove (scored line 30) marking the boundary of the removable plate 20. The scored line 30 facilitates the later removal of the removable plate 20 from the shielding structure 100 along the scored line 30.

The shielding structure 100 further defines an arcuate gap 22 between the removable plate 20 and the connecting board 11 at one corner of the removable plate 20. The arcuate gap 22 communicates with the scored line 30. The arcuate gap 22 is defined by a first arcuate wall 222 and an opposite second arcuate wall 224. A radius R1 of the first arcuate wall 222 can be 1.05 millimeters, and a radius R2 of the second arcuate wall 224 can be 0.55 millimeters. The shielding structure 100 may further define a mating hole 23 adjacent to the arcuate gap 22 for a fingertip tool to pass through the removable plate 20 and grip the underside of the removable plate 20 to separate it from the connecting board 11 at any time in the future. In this exemplary embodiment, the removable plate 20 is rectangular, the arcuate gap 22 and the mating hole 23 are both located at the same end of a diagonal line L of the removable plate 20.

Figure 6:
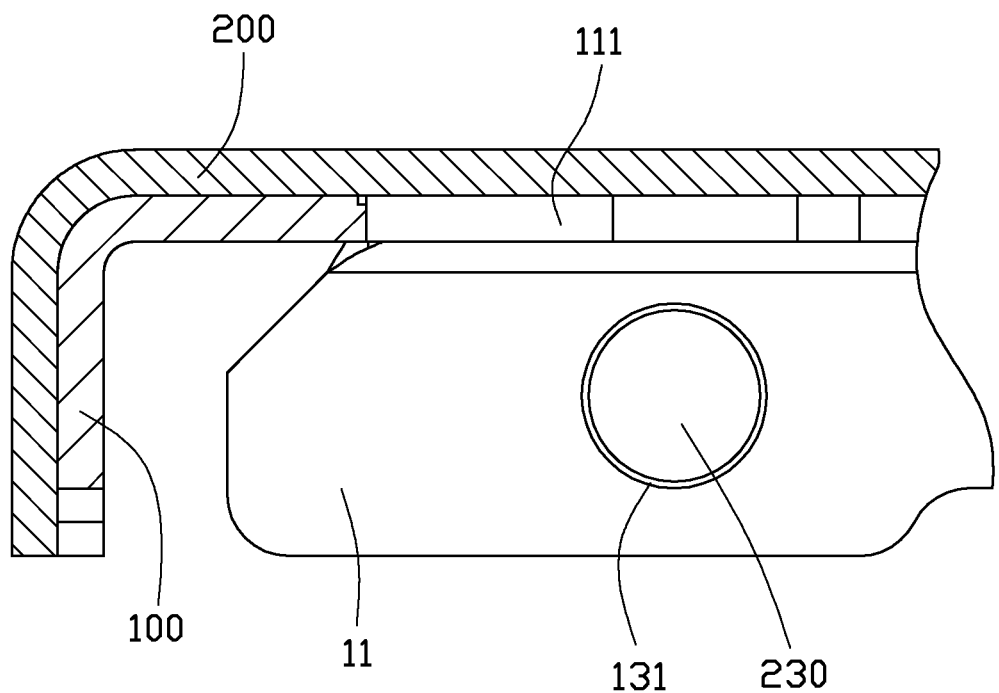
FIG. 6 is a cross-sectional view of the shielding cover encasino the shielding structure after the removable plate has been separated from the shielding structure.

Referring to FIGS. 5 and 6, the shielding cover 200 is part of the EMI shielding for the benefit of the electrical components. The shielding cover 200 and the shielding structure 100 together constitute a complete shielding assembly. The shielding cover 200 encases the shielding structure 100 and blocks the opening 111 after the removable plate 20 has been separated from the connecting board 11. The shielding cover 200 includes a main panel 210 and a peripheral panel 220 protruding from the edges of the main panel 210. The peripheral panel 220 includes a plurality of protrusions 230 corresponding to the latching holes 131. Each protrusion 230 can latch in one of the latching holes 131 to securely latch the shielding cover 200 to the shielding structure 100.

Figure 4:
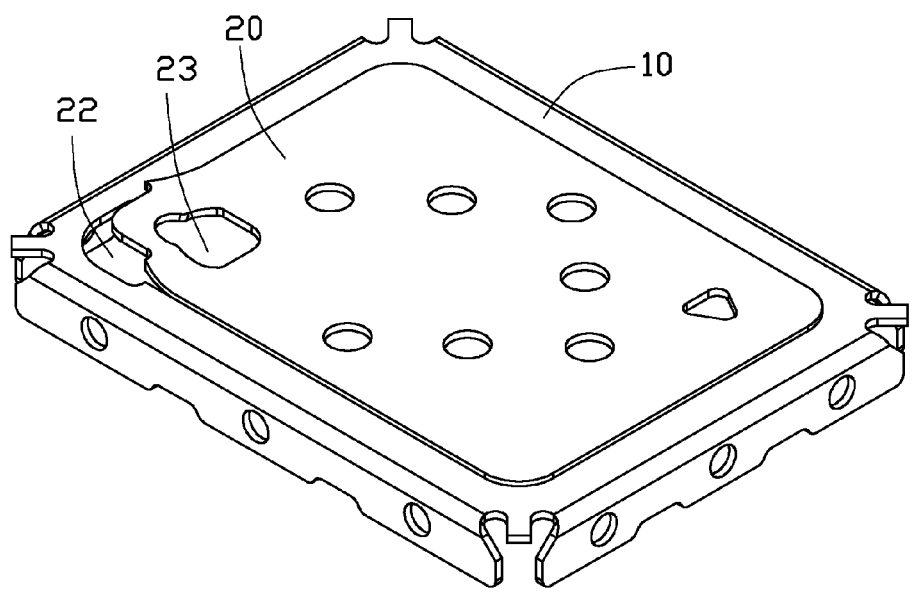
FIG. 4 is a schematic view of the shielding assembly when a removable plate is removed the shielding structure.

Referring to FIGS. 4 and 6, after the shielding structure 100 is mounted to the circuit board, its and the electrical components may need to be repaired, the fingertip or tool can pull the removable plate 20 away from the connecting board 11 along the scored line 30 so the electrical components are exposed for repair. After the electrical components are repaired, the shielding cover 200 may be placed on the shielding structure 100 shielding structure so the opening 111 is shielded again.

In above embodiment, the arcuate gap 22 of the shielding structure 100 potentially increases the shearing stress on the scored line 30, which facilitates the removal of the removable plate 20 at any time.

It is to be further understood that even though numerous characteristics and advantages of the exemplary embodiments have been set forth in the foregoing description, together with details of structures and functions of various embodiments, the disclosure is illustrative only, and changes may be made in detail, especially in the matters of shape, size, and arrangement of parts within the principles of the exemplary disclosure to the full extent indicated by the broad general meaning of the terms in which the appended claims are expressed.

What is claimed is:

1. A shielding structure, comprising:
    a frame including a peripheral wall, a connecting board protruding from an inner surface of the peripheral wall and an opening defined in the connecting board; and
    a removable plate located in the opening and fixed to the connecting board, the removable plate having main planar surfaces not coplanar with main planar surfaces of the connecting board and a peripheral ring groove defined at a first side of the removable plate, a rectangular groove having the same area as the removable plate defined at a second side of the removable plate;

wherein the shielding structure further defines an arcuate gap between the removable plate and the connecting board and communicating with the peripheral ring groove and the rectangular groove, the removable plate define a mating hole adjacent to the arcuate gap.

2. The shielding structure claimed in claim 1, wherein the shielding structure further defines a plurality of latching holes through the peripheral wall.

3. The shielding structure claimed in claim 1, wherein the peripheral ring groove and the rectangular groove facilitate separating the removable plate from the shielding structure along the peripheral ring groove.

4. The shielding structure claimed in claim 1, wherein the removable plate is substantially rectangular, the arcuate gap is defined at one corner of the removable plate.

5. The shielding structure claimed in claim 4, wherein the arcuate gap and the mating hole are both located at a diagonal line of the removable plate.

6. The shielding structure claimed in claim 1, wherein the arcuate gap is defined by a first arcuate wall and an opposite second arcuate wall; a radius of the first arcuate wall is about 1.05 millimeters, and a radius of the second arcuate wall is about 0.55 millimeters.

7. The shielding structure claimed in claim 1, wherein the mating hole is for a driving device to pass through the removable plate so the driving device can mate with the mating hole to drive the removable plate to be separated from the connecting board.

8. A shielding assembly, comprising:
a frame including a peripheral wall, a connecting board protruding from an inner surface of the peripheral wall and an opening defined in the connecting board; and
a removable plate located in the opening and fixed to the connecting board, the removable plate having main planar surfaces not coplanar with main planar surfaces of the connecting board and a peripheral groove defined at a first side of the removable plate, a rectangular groove having the same area as the removable plate defined at a second side of the removable plate;
a scored line defined between the removable plate and the connecting board;
a shielding cover latched to the shielding structure to cover the opening after the removable plate is removed from the opening;
wherein the shielding structure further defines an arcuate gap between the removable plate and the connecting board and communicating with the peripheral ring groove and the rectangular groove, the removable plate define a mating hole adjacent to the arcuate gap.

9. The shielding assembly claimed in claim 8, wherein the shielding structure further defines a plurality of latching holes through the peripheral wall.

10. The shielding assembly claimed in claim 9, wherein the shielding cover includes a main panel and a peripheral panel protruding from the main panel, the peripheral panel includes a plurality of protrusions corresponding to the latching holes, each protrusion is latched in one of the latching holes to latch the shielding cover to the shielding structure.

11. The shielding assembly claimed in claim 8, wherein the peripheral ring groove and the rectangular groove facilitate separating the removable plate from the shielding structure along the peripheral ring groove.

12. The shielding assembly claimed in claim 8, wherein the removable plate is substantially rectangular, the arcuate gap is defined at one corner of the removable plate.

13. The shielding assembly claimed in claim 12, wherein the arcuate gap and the mating hole are both located at a diagonal line of the removable plate.

14. The shielding assembly claimed in claim 8, wherein the arcuate gap is defined by a first arcuate wall and an opposite second arcuate wall; a radius of the first arcuate wall is about 1.05 millimeters, and a radius of the second arcuate wall is about 0.55 millimeters.

15. The shielding assembly claimed in claim 8, wherein the mating hole is for a driving device to pass through the removable plate so the driving device can mate with the mating hole to drive the removable plate to be separated from the connecting board.

\* \* \* \* \*